(12) United States Patent
Shie et al.

(10) Patent No.: US 9,059,384 B2
(45) Date of Patent: Jun. 16, 2015

(54) LED PACKAGING CONSTRUCTION AND MANUFACTURING METHOD THEREOF

(71) Applicant: Unistars, Hsinchu (TW)

(72) Inventors: Shin-Shien Shie, Zhongli (TW);
Tien-hao Huang, Zhongli (TW);
Shang-Yi Wu, Hsinchu (TW); Yi-chun Wu, Miaoli County (TW)

(73) Assignee: Unistars, Hsinchu County (TW)

( * ) Notice: Subject to any disclaimer, the term of this patent is extended or adjusted under 35 U.S.C. 154(b) by 34 days.

(21) Appl. No.: 13/835,364

(22) Filed: Mar. 15, 2013

(65) Prior Publication Data

US 2014/0151730 A1    Jun. 5, 2014

(30) Foreign Application Priority Data

Nov. 30, 2012 (TW) .............................. 101145197 A

(51) Int. Cl.
*H01L 33/00* (2010.01)
*H01L 33/60* (2010.01)
*H01L 33/48* (2010.01)

(52) U.S. Cl.
CPC .............. *H01L 33/60* (2013.01); *H01L 33/486* (2013.01); *H01L 2933/0033* (2013.01); *H01L 2933/0058* (2013.01); *H01L 2224/48091* (2013.01)

(58) Field of Classification Search
USPC .......................................................... 257/98
See application file for complete search history.

(56) References Cited

U.S. PATENT DOCUMENTS

| | | | |
|---|---|---|---|
| 2003/0219919 A1* | 11/2003 | Wang et al. ...................... 438/26 |
| 2008/0006837 A1* | 1/2008 | Park et al. ......................... 257/98 |
| 2008/0062701 A1* | 3/2008 | Harrah et al. .................. 362/296 |
| 2010/0071936 A1* | 3/2010 | Tan ................................. 174/252 |
| 2010/0193825 A1* | 8/2010 | Yang ................................. 257/99 |
| 2010/0207142 A1* | 8/2010 | Chen et al. ....................... 257/98 |
| 2011/0006318 A1* | 1/2011 | Chung ............................. 257/91 |
| 2011/0169034 A1* | 7/2011 | Tseng et al. ..................... 257/98 |
| 2012/0098006 A1* | 4/2012 | Chen et al. ...................... 257/98 |
| 2012/0241773 A1* | 9/2012 | Chang et al. .................... 257/88 |

* cited by examiner

*Primary Examiner* — Thien F Tran
(74) *Attorney, Agent, or Firm* — Alan D. Kamrath; Kamrath IP Lawfirm, P.A.

(57) ABSTRACT

LED packaging construction includes a substrate, a cavernous construction, a LED, and a reflection layer. The substrate is daubed with an insulation layer and a circuit layer on a surface on the substrate, wherein the substrate is made of metal, and the insulation layer is disposed between the circuit layer and the substrate. The cavernous construction is disposed on the substrate and surrounds the LED, and is formed by disposing a photoresist layer and patterning the photoresist layer. The circuit layer electrically connects the LED through a conducting wire. The reflection layer is at least disposed on a first surface of the cavernous construction, wherein the first surface surrounds the LED and faces toward the LED, and a part of light emitted from the LED is reflected by the reflection layer.

15 Claims, 20 Drawing Sheets

LED PACKAGING CONSTRUCTION AND MANUFACTURING METHOD THEREOF

CROSS-REFERENCE TO RELATED APPLICATION

This application claims priority from Taiwan Patent Application No. 101145197, filed on Nov. 30, 2012, the contents of which are hereby incorporated by reference in their entirety for all purposes.

FIELD OF THE INVENTION

The present invention relates to a light emitting diode (LED) packaging construction and a related manufacturing method, and more particularly, to a LED packaging construction with a cavernous construction and a method for fabricating the LED packaging construction with the cavernous construction.

BACKGROUND OF THE INVENTION

Generally, LEDs need to be carried on the packaging construction for applying to different kinds of electronic devices. For different LEDs, the packaging construction has to be modified correspondingly in order to increase the efficiency of the LEDs. For example, if the packaging construction only provides a flat plane to carry the LED, the light emitted from the laterals of the LED might not be utilized but wasted. More particularly, as referred to the plane provided by the packaging construction, the lights emitted from the LED can be roughly classified as vertical lights and horizontal lights. In the prior art, to utilize the horizontal lights (parallel to the plane provided by the packaging construction), the packaging construction is disposed with a cavity and the cavity is daubed with a reflection layer, and the LED is then placed in the cavity. In this way, the horizontal lights emitted from the LED can be reflected by the reflection layer daubed on the inner wall of the cavity and then emit perpendicular to the plane provided by the packaging construction, which increases light utilization efficiency.

However, in the prior art, the substrate of the packaging construction is generally made of plastic for reducing costs, which decreases the heat-dissipation performance of the substrate. When the LED is of high-power LED, this kind of packaging construction is not able to dissipate heat generated from the high-power LED effectively, causing the overall temperature to rise and further breaking down the packaging construction because of the accumulated heat (thermal breakdown). Therefore, in the prior art, ceramic substrates or silicon substrates are used to replace the plastic substrates for solving heat dissipation problem. However, the ceramic substrates can dissipate heat effectively but the cost of the ceramic substrates is too expensive, and the silicon substrates cannot reduce the dimension of the cavity corresponding to the dimension of the LED because of the fabrication limits.

SUMMARY OF THE INVENTION

The present invention provides a light emitting diode (LED) packaging construction. The LED packaging construction comprises a metal substrate; an insulation layer disposed on the metal substrate; a circuit layer disposed on the metal substrate; a cavernous construction disposed on the substrate; a reflection layer disposed on a first surface of the cavernous construction; and an LED disposed in the cavernous construction and electrically connected to the circuit layer.

The present invention further provides a manufacturing method for an LED packaging construction. The manufacturing method comprises (a) providing a metal substrate; (b) forming an insulation layer on the metal substrate; (c) forming a circuit layer on the insulation layer; (d) forming a cavernous construction on the metal substrate; (e) forming a reflection layer on a first surface of the cavernous construction; and (f) disposing an LED in the cavernous construction.

These and other objectives of the present invention will no doubt become obvious to those of ordinary skill in the art after reading the following detailed description of the preferred embodiment that is illustrated in the various figures and drawings.

DETAILED DESCRIPTION OF THE INVENTION

Figure 1:
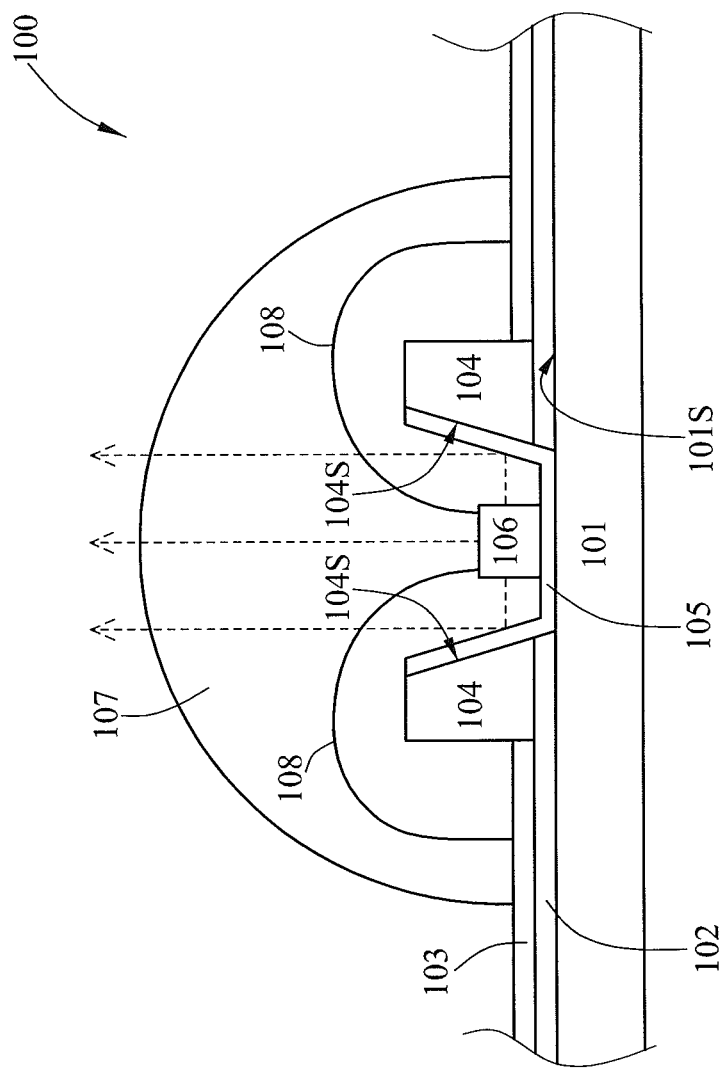
FIG. 1 is a diagram illustrating an LED packaging construction according to a first embodiment of the present invention.

Please refer to FIG. 1. which illustrates an LED packaging construction 100 according to a first embodiment of the present invention. The LED packaging construction 100 comprises a substrate 101, an insulation layer 102, a circuit layer 103, a cavernous construction 104, a reflection layer 105, a LED 106, a transparent epoxy or silicone 107, and conducting wires 108. In the present embodiment, the substrate 101 is made of copper for heat dissipation, but can be made of other metal material such as aluminum. The surface of the substrate 101 is daubed with the insulation layer 102 and the circuit layer 103. The cavernous construction 104 is disposed on the plane/surface 101S of the substrate 101 and surrounds the LED 106. However, the disposition of the cavernous construction 104 is not limited to be on the surface of the substrate 101, and can be on other position such as on the insulation layer 102. The reflection layer 105 is disposed on the surface 104S of the cavernous construction 104 for reflecting the light emitted from the LED 106 (as the dash line shown in FIG. 1). The LED 106 electrically connects the circuit layer 103 through the conducting wires 108 for receiving power so as to emit light. The transparent epoxy or silicone 107 is used to cover the LED 106 and guide the light emitted from the LED 106.

The first feature of the first embodiment of the present invention is that the LED is disposed in the cavernous construction 104, and the surface 104S of the cavernous construction 104 is disposed with the reflection layer 105. In other words, the cavernous construction 104 surrounds the LED 106, and the reflection layer 105 disposed on the surface 104S of the cavernous construction 104 surrounds the LED 106 as well. In this way, the light emitted from laterals of the LED 106 can be reflected by the reflection layer 105, and the reflected light can be emitted with the light emitted from the front of the LED 106 so that the light emitted from laterals of the LED 106 would be extracted effectively, which increases light utilization efficiency of the LED 106. Therefore, the angle between the surface 104S of the cavernous construction 104 and the surface 101S of the substrate 101 needs to be designed appropriately so that after the light emitted from the laterals of the LED 106 is reflected by the reflection layer 105, and the light utilization efficiency can be increased.

Besides, the cavernous construction 104 can be formed by depositing or daubing a photoresist layer and patterning the said photoresist layer. That is, the cavernous construction 104 is actually a wall formed by the photoresistor and as a support for the reflection layer 105 so that the light emitted from laterals of the LED 106 can be reflected by the reflection layer 105.

The second feature of the first embodiment of the present invention is that the substrate 101 is made of copper. Since the coefficient of thermal conductivity of copper is higher, when the LED 106 is of high-power LED, the heat generated from the high-power LED is still able to be dissipated by copper substrate 101, and thus achieve better efficiency and reliability.

Please refer to FIG. 2 and FIG. 3A to FIG. 3G FIG. 2 and FIG. 3A to FIG. 3G illustrate a manufacturing method 200 for the LED packaging construction according to the first embodiment of the present invention. The steps are described as follows.

Step S21: Provide a substrate;
Step S22: Form an insulation layer on the substrate;
Step S23: Form a cavernous construction on the substrate;
Step S24: Form a circuit layer and a reflection layer;
Step S25: Dispose an LED on the substrate;
Step S26: Dispose conducting wires for electrically connecting the LED and the circuit layer;
Step S27: Dispose a transparent epoxy or silicone to cover the LED.

Figure 3A:
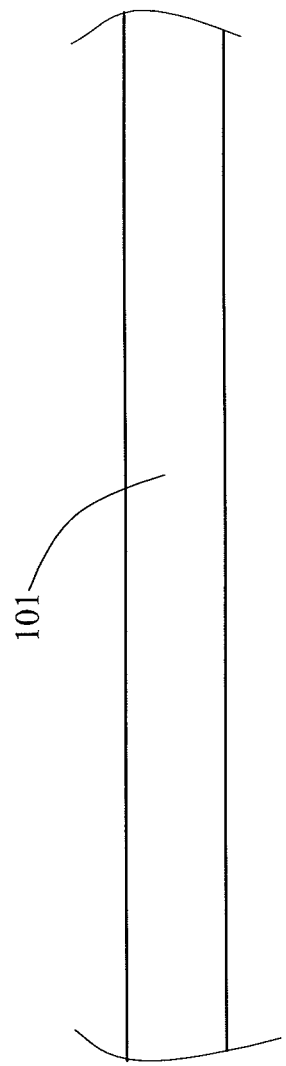
Figure 3B:
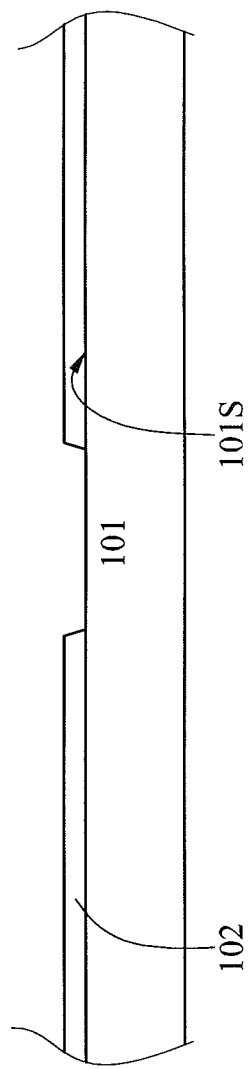
Figure 3C:
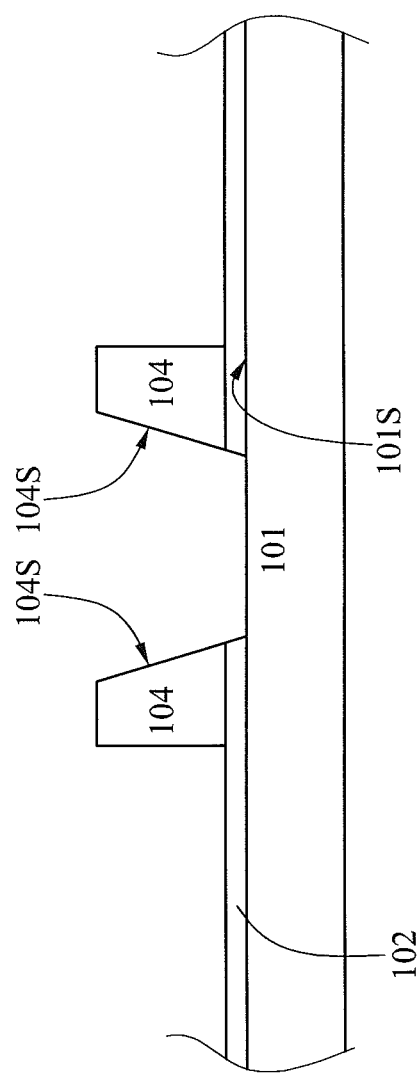
Figure 3D:
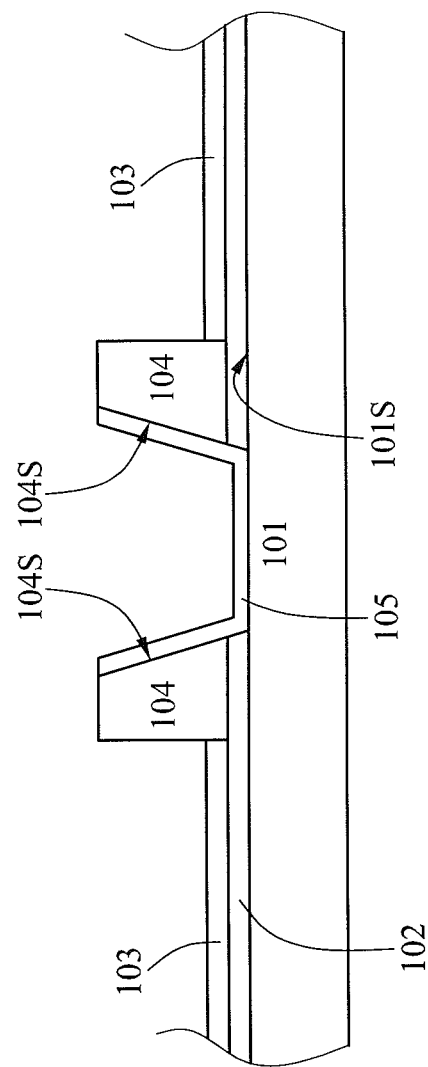
Figure 3E:
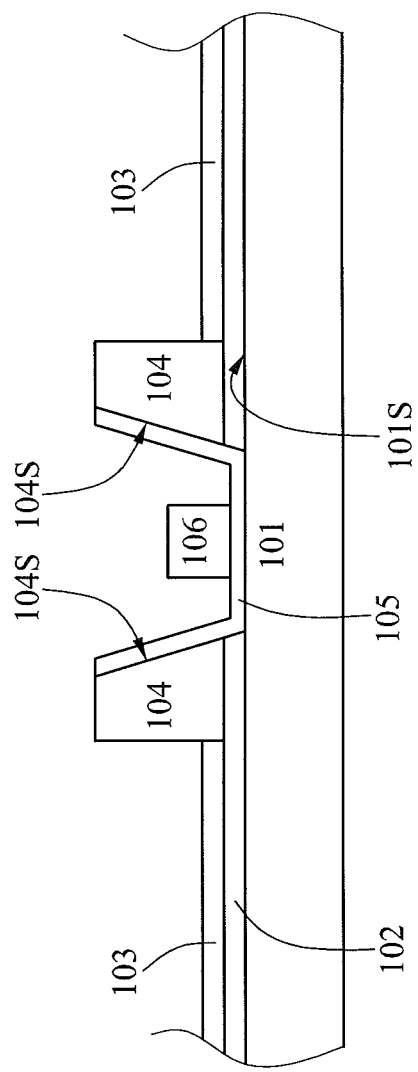
Figure 3F:
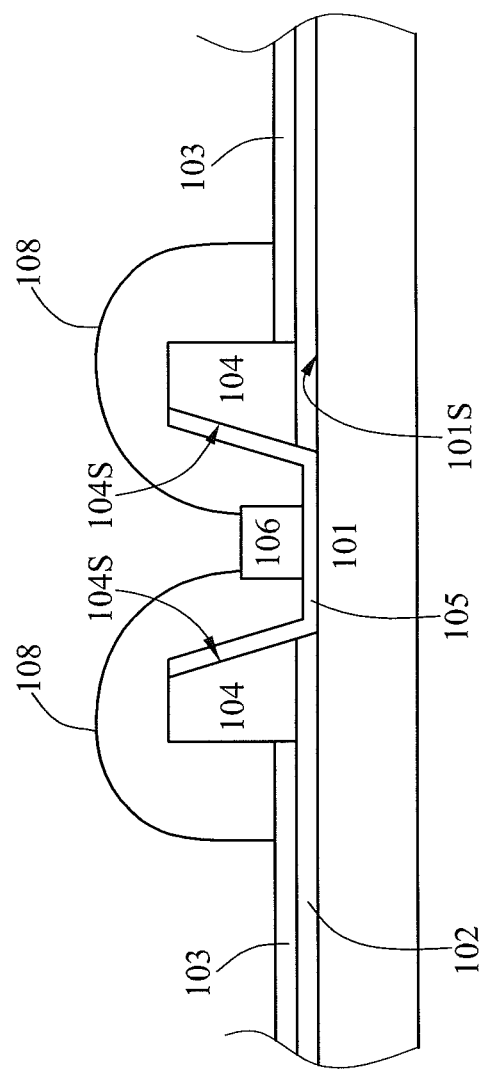
Figure 3G:
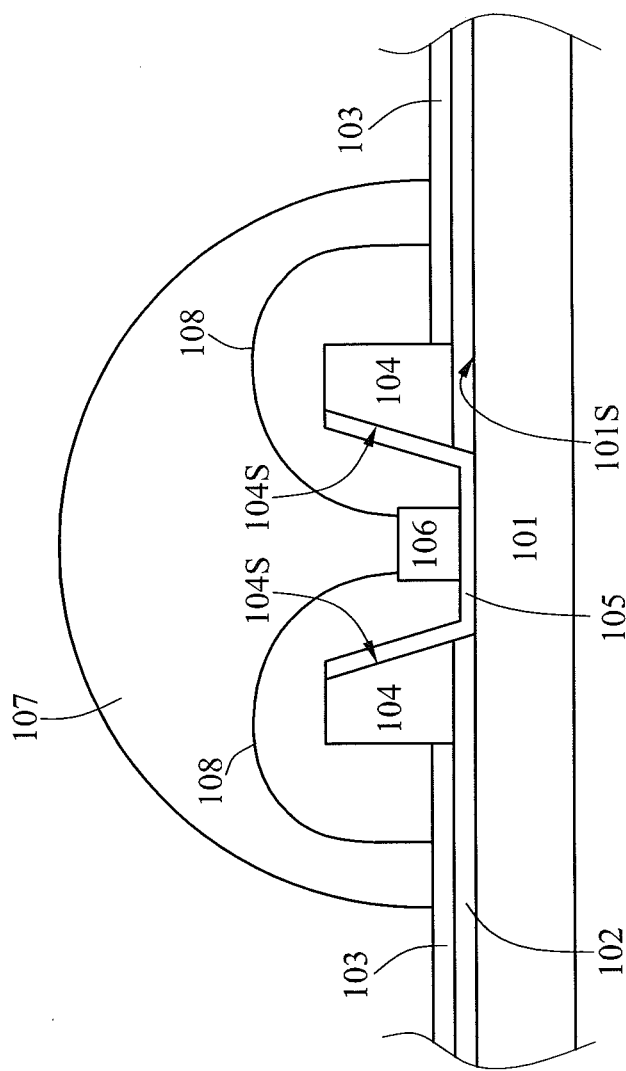

First, please refer to FIG. 3A, the manufacturing method 200 executes step S21 to provide a substrate 101. Second, please refer to FIG. 3B, the manufacturing method 200 executes step S22 to form an insulation layer 102 on the substrate 101. After that, please refer to FIG. 3C, the manufacturing method 200 executes step S23 to form a cavernous construction 104 which can be done by disposing a photoresist layer and patterning the said photoresist layer. Then, please refer to FIG. 3D, the manufacturing method 200 executes step S24 to form a circuit layer 103 and a reflection layer 104 on the surface 104S of the cavernous construction 104. Next, please refer to FIG. 3E, the manufacturing method 200 executes step S25 to dispose an LED 106 in the cavernous construction 104 and also on the substrate 101. Then, please refer to FIG. 3F, the manufacturing method 200 executes step S26 to dispose conducting wires 108 for electrically connecting the LED 106 to the circuit layer 103 (the conducting wires 108 can be connected to the surface outside the cavity or surface inside the cavity). Finally, please refer to FIG. 3G, the manufacturing method 200 executes step S27 to dispose a transparent epoxy or silicone 107 to cover the LED 106.

Figure 4:
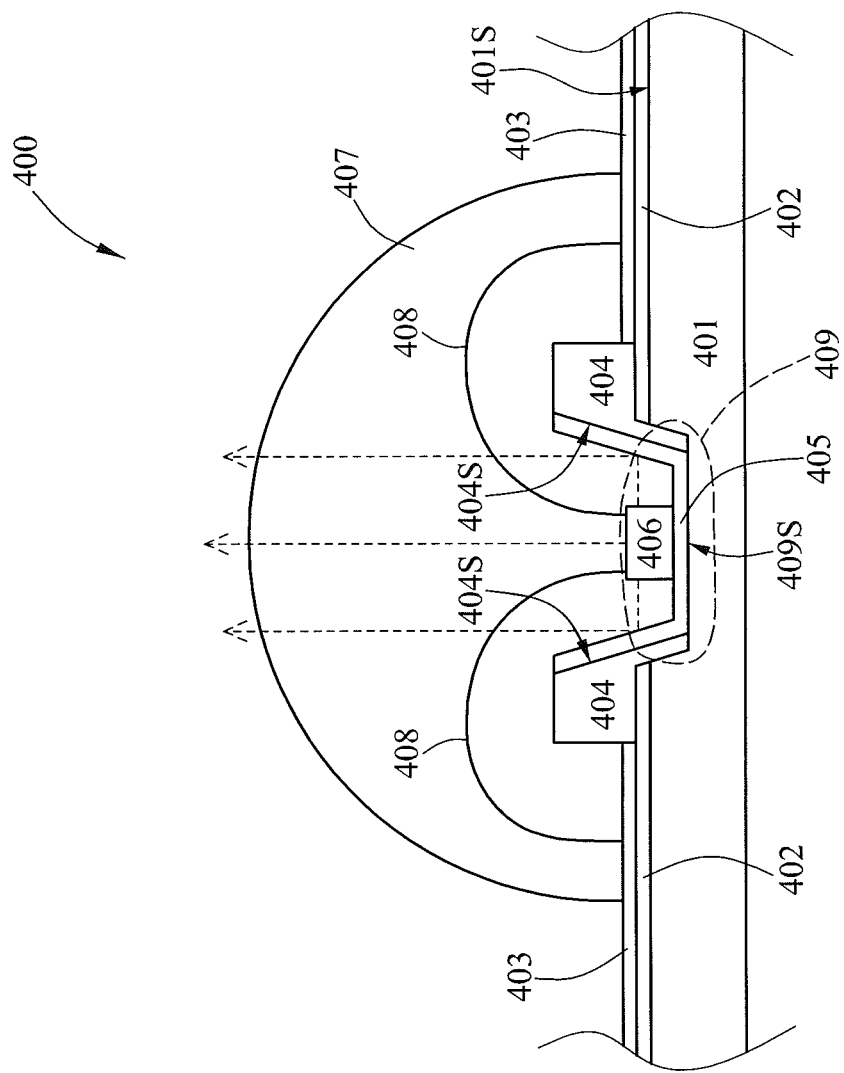
FIG. 4 is a diagram illustrating an LED packaging construction according to a second embodiment of the present invention.
Figure 5:
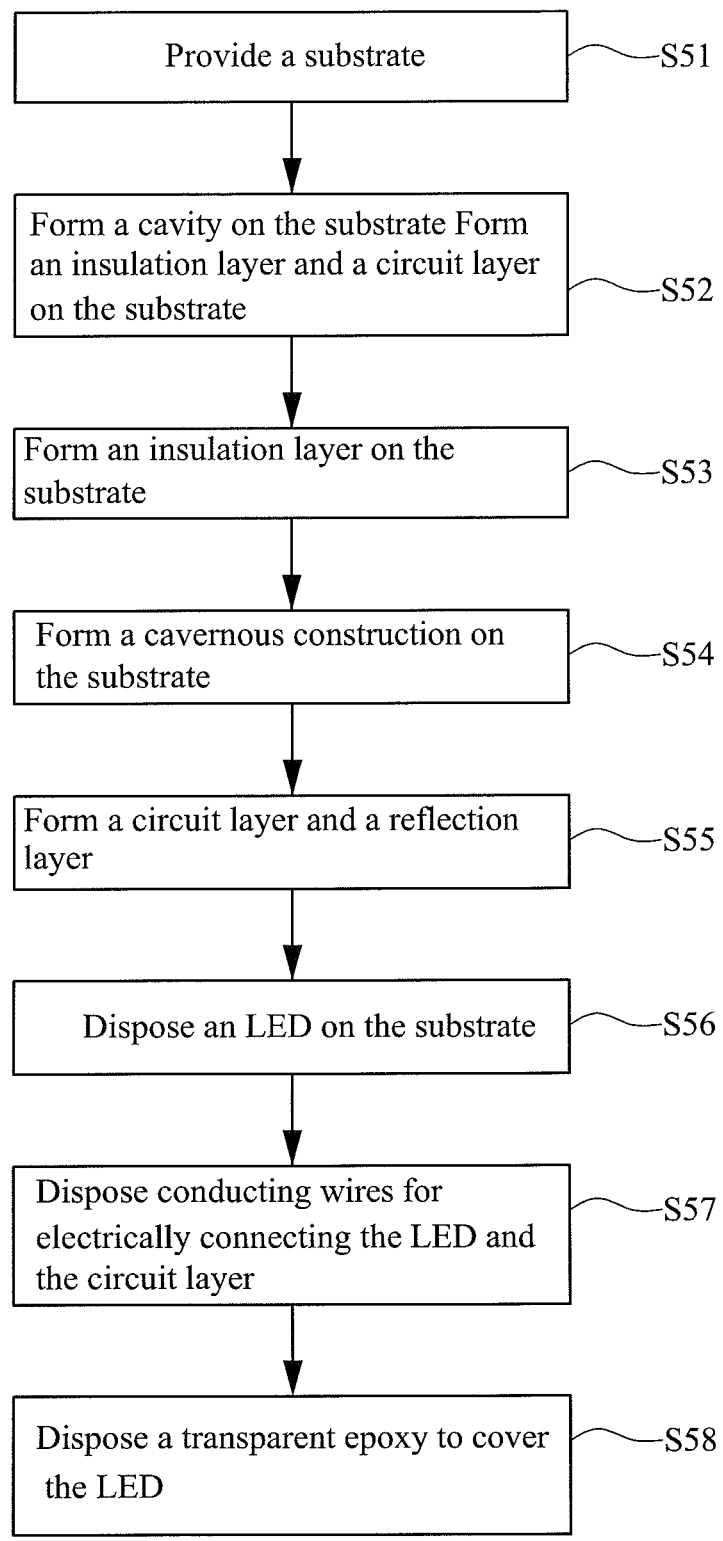
FIG. 5 and FIG. 6A~FIG. 6H illustrate a manufacturing method for the LED packaging construction according to the second embodiment of the present invention.

Please refer to FIG. 4. FIG. 4 is a diagram illustrating an LED packaging construction 400 according to a second embodiment of the present invention. The LED packaging construction 400 comprises a substrate 401, an insulation layer 402, a circuit layer 403, a cavernous construction 404, a reflection layer 405, a LED 406, a transparent epoxy or silicone glue 407, a plurality of conducting wires 408, and a cavity 409. In the present embodiment, the substrate 401 is made of copper for heat dissipation, but can be made of other metal material such as aluminum or alloy of aluminum and copper. The surface of the substrate 401 is daubed with the insulation layer 402 and the circuit layer 403. The difference between the LED packaging constructions 100 and 400 is that in the LED packaging construction 400, the substrate 401 is further disposed with a cavity 409, and the position of the cavity 409 is set corresponding to the cavernous construction 404. More particularly, the cavernous construction 404 is disposed on the surface 401S of the substrate 401 and the cavity 409, and surrounds the LED 406. The reflection layer 405, for reflecting the light emitted from the LED 406 (as the dash line shown in FIG. 4), is disposed on the surface 404S of the cavernous construction 404 and the surface 409S of the cavity 409. The LED 406 electrically connects the circuit layer 403 through the conducting wires 408 for receiving power and emitting light. The transparent epoxy or silicone 407 is used to cover the LED 406 and conduct the light emitted from the LED 406.

The first feature of the second embodiment of the present invention is that the LED 406 is disposed in the cavernous construction 404 and the cavity 409, and the surface 404S of the cavernous construction 404 and the surface 409S of the cavity 409 are disposed with the reflection layer 405. In other words, the cavernous construction 404 surrounds the LED 406, and the reflection layer 405 disposed on the surface 404S of the cavernous construction 404 surrounds the LED 406 as well. In this way, the light emitted from laterals of the LED 406 can be reflected by the reflection layer 405, so that the light emitted from laterals of the LED 406 would not be wasted, which increases light utilization efficiency of the LED 406. Therefore, the angle between the surface 104S of the cavernous construction 404 and the surface 401S of the substrate 401 needs to be designed appropriately so that after the light emitted from the laterals of the LED 406 is reflected by the reflection layer 405, and the light utilization efficiency can be increased.

Besides, the cavity 409 can be formed by etching the substrate 401 or stamping the substrate 401. The cavernous construction 404 can be formed by depositing a photoresist layer and patterning the said photoresist layer. Thus, by the depth provided by the cavity 409, the height of the cavernous construction 404 protruding from the substrate 401 can be reduced. That is, the wall made of the photoresist layer comprises two parts: one part is in the cavity 409, and the other part protrudes from the substrate 401. Furthermore, the wall made of the photoresist layer of the cavernous construction 404 serves as a support for the reflection layer 405 so that the light emitted from laterals of the LED 406 can be reflected by the reflection layer 405. Finally, as for the two parts of the wall made of the photoresist layer of the cavernous construction 404 are connected smoothly. In other words, the surface of the cavity 409 connects to the surface of the substrate 401, which avoids the light emitted from laterals of the LED 406 being wasted.

The second feature of the second embodiment of the present invention is that the substrate 401 is made of copper. Since the coefficient of thermal conductivity of copper is higher, when the LED 406 is of high-power LED, the heat generated from the high-power LED is still dissipated quickly by copper substrate 401, and thus the thermal breakdown would not occur.

Please refer to FIG. 5 and FIG. 6A to FIG. 6H. FIG. 5 and FIG. 6A to FIG. 6H illustrate a manufacturing method 500 for the LED packaging construction according to the second embodiment of the present invention. The steps are described as follows.

Step S51: Provide a substrate;
Step S52: Form a cavity on the substrate;
Step S53: Form an insulation layer on the substrate;
Step S54: Form a cavernous construction on the substrate;
Step S55: Form a circuit layer and a reflection layer;
Step S56: Dispose an LED on the substrate;
Step S57: Dispose conducting wires for electrically connecting the LED and the circuit layer;
Step S58: Dispose a transparent epoxy or silicone to cover the LED.

Figure 6A:
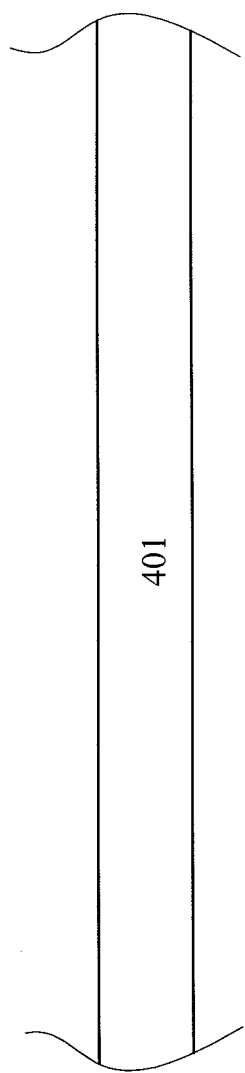
Figure 6B:
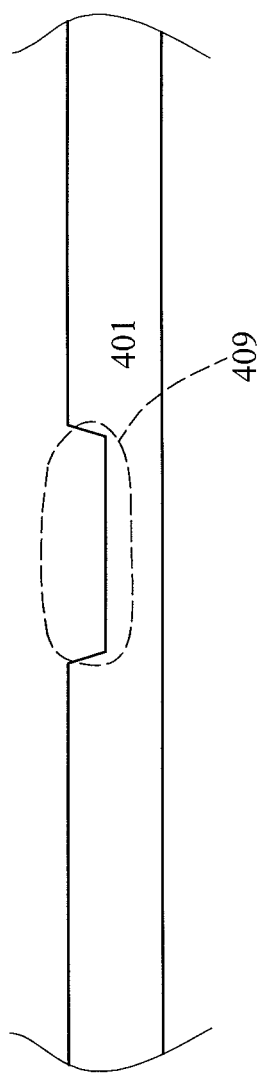
Figure 6C:
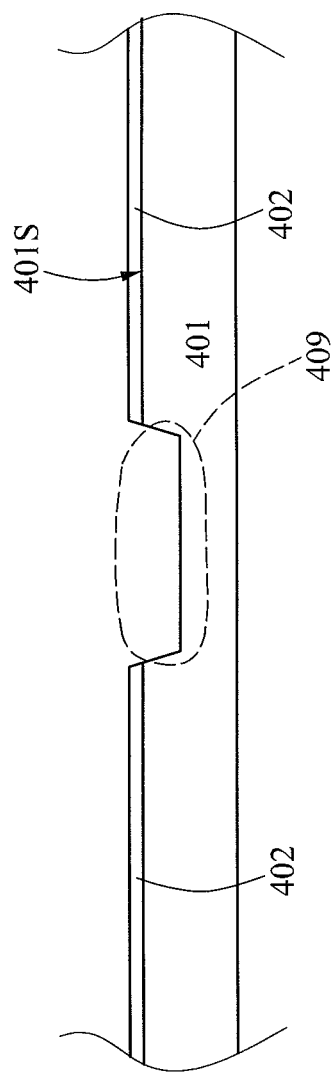
Figure 6D:
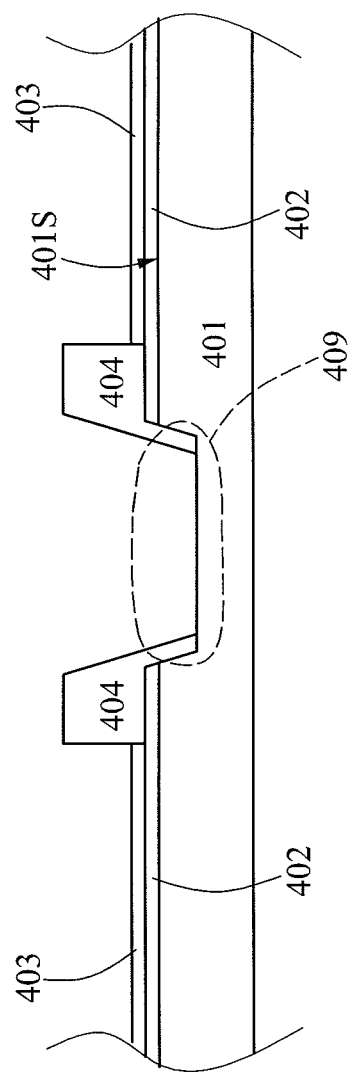
Figure 6E:
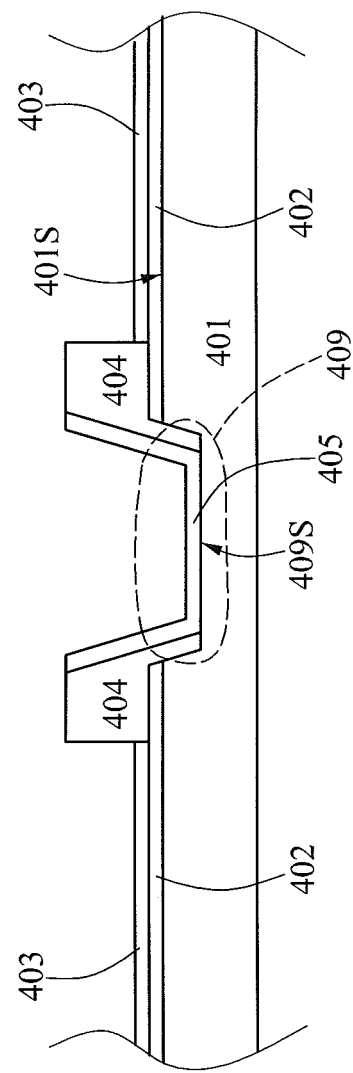
Figure 6F:
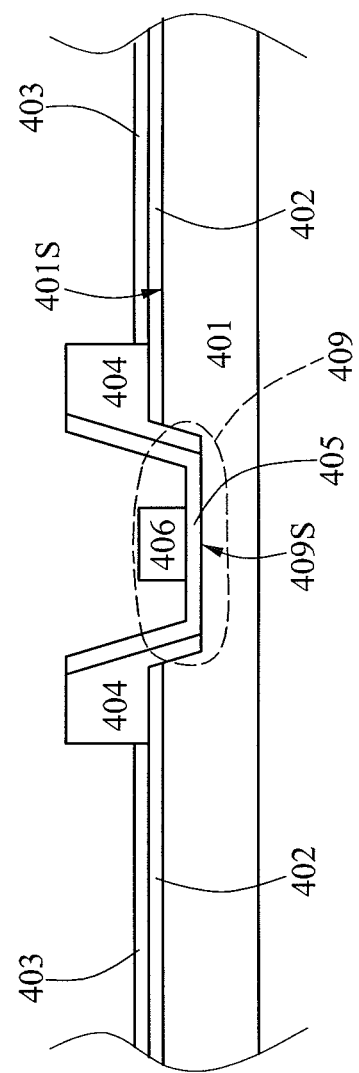
Figure 6G:
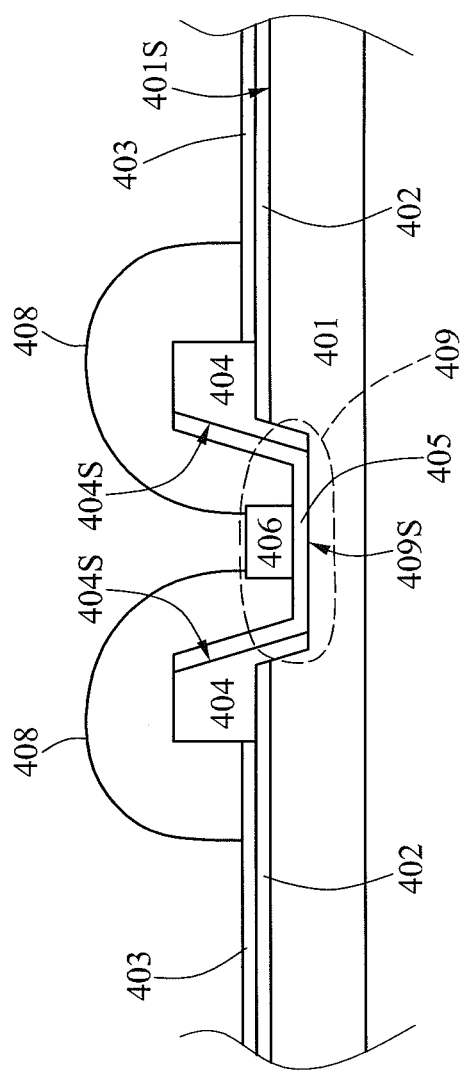
Figure 6H:
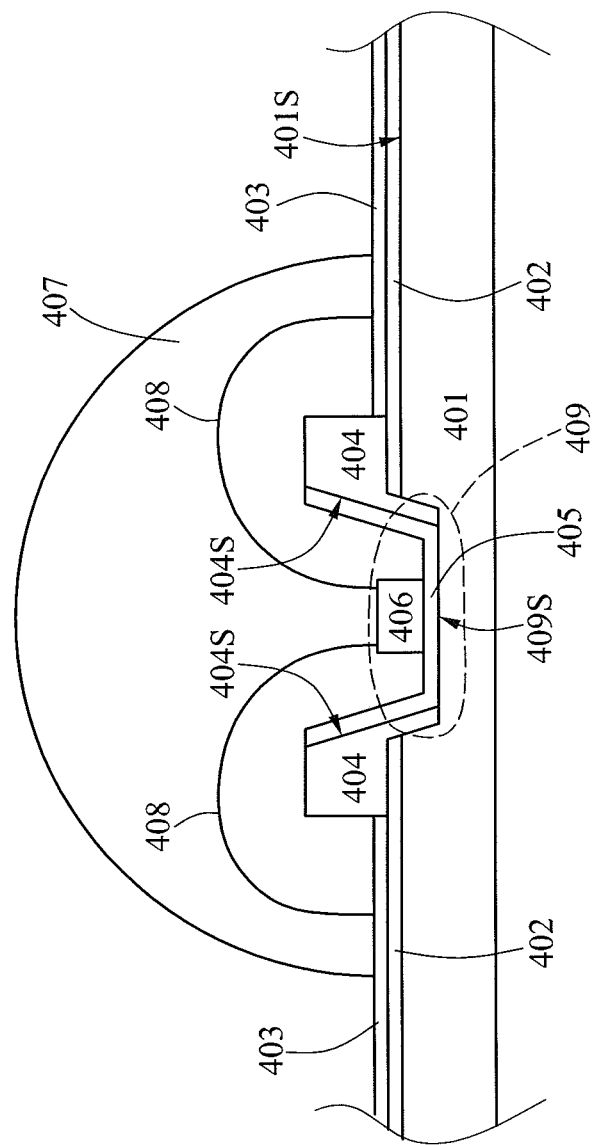

First, please refer to FIG. 6A, the manufacturing method 500 executes step S51 to provide a substrate 401. Second, please refer to FIG. 6B, the manufacturing method 500 executes step S52 to form a cavity 409 on the substrate 401. The cavity 409 can be made by etching the substrate 401 or stamping the substrate 401. After that, please refer to FIG. 6C, the manufacturing method 500 executes step S53 to form an insulation layer. Next, please refer to FIG. 6D, the manufacturing method 500 executes step S54 to form a cavernous construction 404 on the substrate 401, which can be done by disposing a photoresist layer and patterning the said photoresist layer. Then, please refer to FIG. 6E, the manufacturing method 500 executes step S55 to form a circuit layer 403 and a reflection layer 405 on the surface 404S of the cavernous construction 404 and the surface 409S of the cavity 409. Next, please refer to FIG. 6F, the manufacturing method 500 executes step S56 to dispose an LED 406 in the cavernous construction 404 and also on the substrate 401. Then, please refer to FIG. 6G, the manufacturing method 500 executes step S57 to dispose conducting wires 408 for electrically connecting the LED 406 to the circuit layer 403. Finally, please refer to FIG. 6H, the manufacturing method 500 executes step S58 to dispose a transparent epoxy or silicone 407 to cover the LED 406.

Figure 7:
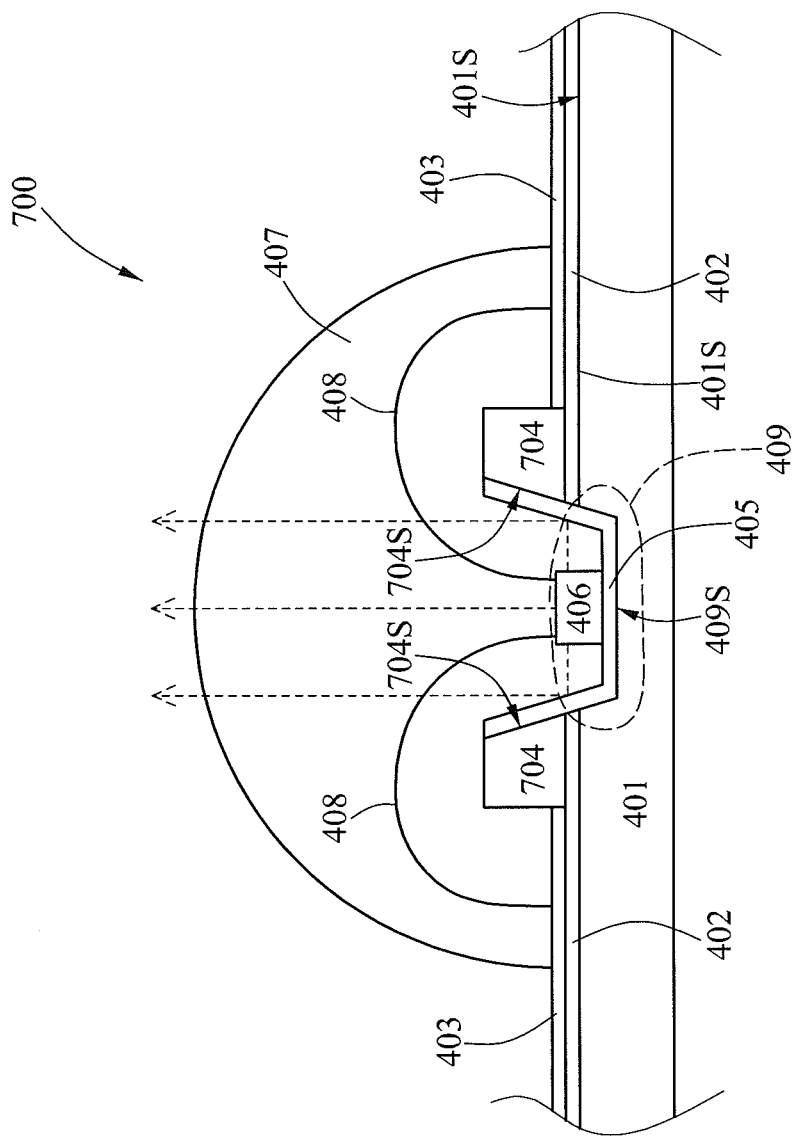
FIG. 7 is a diagram illustrating an LED packaging construction according to a third embodiment of the present invention.

Please refer to FIG. 7. FIG. 7 is a diagram illustrating an LED packaging construction 700 according to a third embodiment of the present invention. The LED packaging construction 700 comprises a substrate 401, an insulation layer 402, a circuit layer 403, a cavernous construction 704, a reflection layer 405, an LED 406, a transparent epoxy or silicone 407, conducting wires 408, and a cavity 409. The LED packaging constructions 700 and 400 are similar but different in their cavernous constructions. The cavernous construction 404 is disposed on the surface 401S of the substrate 401 and the surface 409S of the cavity 409, but the cavernous construction 704 is only disposed on the surface 401S of the substrate 401.

Figure 2:
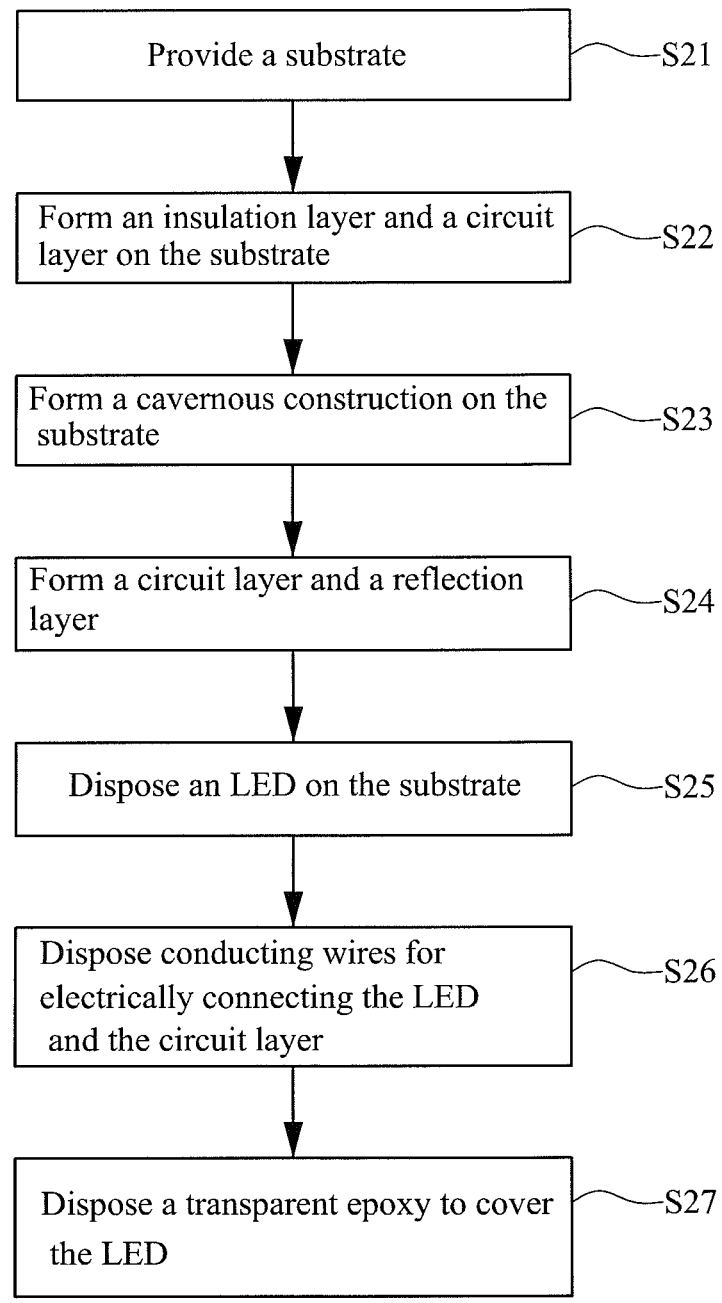
FIG. 2 and FIG. 3A~FIG. 3G illustrate a manufacturing method for the LED packaging construction according to the first embodiment of the present invention.

Additionally, in the above embodiments, the mentioned LEDs are not daubed with fluorescent layers so that the light emitted from the LED packaging construction is decided by the LED chip. That is, if the LED emits blue light (the LED is blue light LED), the light emitted from the LED packaging construction is blue. However, the LED can be daubed with fluorescent layer in step S26 and step S27 as shown in FIG. 2. The daubed fluorescent layer as mentioned in steps S26 and S27 can be made of yellow fluorescent powders. Consequently, if the LED is blue light LED, the color of the light emitted from the blue light LED will be changed by the yellow mask of the yellow fluorescent layer and becomes white. In this way, the LED packaging construction with the yellow fluorescent layer can apply to blue light LEDs for emitting white light.

To sum up, the LED packaging construction of the present invention replaces the substrate of prior art with metal substrate such as copper for higher heat dissipation so that when the LED packaging construction of the present invention carries a high-power LED, thermal breakdown can be avoided. Meanwhile, by disposing the cavernous construction and daubing the reflection layer on the cavernous construction, it will increase light utilization efficiency.

Those skilled in the art will readily observe that numerous modifications and alterations of the device and method may be made while retaining the teachings of the invention. Accordingly, the above disclosure should be construed as limited only by the meters and bounds of the appended claims.

What is claimed is:

1. A light emitting diode (LED) packaging construction, comprising:
   a metal substrate;
   a cavity formed in the metal substrate;
   an insulation layer disposed on the metal substrate;
   a circuit layer disposed on the metal substrate;
   a cavernous construction disposed at a periphery of the cavity of the metal substrate;
   a reflection layer disposed on a first surface of the cavernous construction and a surface of the cavity; and
   an LED disposed in the cavernous construction and electrically connected to the circuit layer;
   wherein the cavernous construction surrounds the LED, and the first surface faces the LED.

2. The LED packaging construction of claim 1, wherein the cavernous construction is a photoresist layer.

3. The LED packaging construction of claim 1, wherein the metal substrate comprises a plane, and the cavernous construction is disposed on the plane.

4. The LED packaging construction of claim 3, wherein a cavity is formed on the metal substrate, and a lower part of the cavernous construction is disposed in the cavity.

5. The LED packaging construction of claim 3, wherein the first surface of the cavernous construction connects a surface of the cavity.

6. The LED packaging construction of claim 1, further comprising a transparent epoxy or silicone for covering the LED.

7. The LED packaging construction of claim 1, wherein the metal substrate is made of copper, aluminun, or alloy of copper and aluminum.

8. A manufacturing method for an LED packaging construction, comprising:
   (a) providing a metal substrate, and forming a cavity in the metal substrate;
   (b) forming an insulation layer on the metal substrate;
   (c) forming a circuit layer on the insulation layer;
   (d) forming a cavernous construction on the metal substrate;
   (e) forming a reflection layer on a first surface of the cavernous construction; and
   (f) disposing an LED in the cavernous construction wherein the cavernous construction surrounds the LED, and wherein the first surface faces the LED.

9. The manufacturing method of claim 8, further comprising a process of depositing a photoresist layer and patterning the said photoresist layer to form the cavernous construction.

10. The manufacturing method of claim 8, further comprising forming the cavernous construction on the cavity.

11. The manufacturing method of claim 8, wherein the cavity is formed by stamping the metal substrate.

12. The manufacturing method of claim 8, wherein the cavity is formed by etching the metal substrate.

13. The manufacturing method of 8, further comprising forming the cavernous construction on a planar substrate.

14. The manufacturing method of claim 8, further comprising forming the cavernous construction around the cavity.

15. The manufacturing method of claim 8, further comprising forming a reflection layer on the cavity and on the first surface of the cavernous construction.

* * * * *